(12) United States Patent
Lu

(10) Patent No.: US 12,224,205 B2
(45) Date of Patent: Feb. 11, 2025

(54) SEMICONDUCTOR MEMORY DEVICE AND MANUFACTURING METHOD THEREOF

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 504 days.

(21) Appl. No.: 17/647,773

(22) Filed: Jan. 12, 2022

(65) Prior Publication Data
US 2022/0310447 A1   Sep. 29, 2022

Related U.S. Application Data

(63) Continuation of application No. PCT/CN2021/120405, filed on Sep. 24, 2021.

(30) Foreign Application Priority Data

Mar. 25, 2021 (CN) ............... 202110320833.6

(51) Int. Cl.
*H01L 21/768* (2006.01)
*H01L 23/528* (2006.01)
(Continued)

(52) U.S. Cl.
CPC .... *H01L 21/76837* (2013.01); *H01L 23/5283* (2013.01); *H01L 23/53266* (2013.01);
(Continued)

(58) Field of Classification Search
CPC .......... H01L 21/76837; H01L 23/5283; H01L 23/53266; H01L 23/53295; H10B 12/0335; H10B 12/03; H10B 12/482
See application file for complete search history.

(56) References Cited

U.S. PATENT DOCUMENTS 10,777,559 B1 * 9/2020 Wu .................. H10B 12/0335
2020/0119021 A1   4/2020 Ma et al.

FOREIGN PATENT DOCUMENTS

CN       101847637 A  *  9/2010  ....... H01L 27/10876
CN       110364485 A      10/2019
(Continued)

OTHER PUBLICATIONS

International Search Report cited in PCT/CN2021/120405 mailed Dec. 29, 2021, 9 pages.

*Primary Examiner* — Brook Kebede
(74) *Attorney, Agent, or Firm* — Syncoda LLC; Feng Ma

(57) ABSTRACT

The present disclosure provides a semiconductor memory device and a manufacturing method thereof. The manufacturing method includes: providing a substrate having a plurality of active areas; forming a plurality of bit line structures on the substrate, where the plurality of bit line structures are sequentially provided at intervals along a first direction; forming a dielectric layer on the substrate; etching the dielectric layer, to form a plurality of contact holes and a plurality of isolation structures, where each contact hole is between the adjacent bit line structures, the plurality of contact holes and the plurality of isolation structures are alternately provided along a second direction, the first direction is not parallel to the second direction; and forming an isolation layer on a side wall of each bit line structure and a side wall of each isolation structure.

18 Claims, 13 Drawing Sheets

(51) Int. Cl.
*H01L 23/532* (2006.01)
*H10B 12/00* (2023.01)

(52) U.S. Cl.
CPC ... *H01L 23/53295* (2013.01); *H10B 12/0335* (2023.02); *H10B 12/31* (2023.02); *H10B 12/482* (2023.02)

(56) References Cited

FOREIGN PATENT DOCUMENTS

| | | |
|---|---|---|
| CN | 210110766 U | 2/2020 |
| CN | 111463207 A | 7/2020 |
| CN | 111627910 A | 9/2020 |

* cited by examiner

SEMICONDUCTOR MEMORY DEVICE AND MANUFACTURING METHOD THEREOF

CROSS-REFERENCE TO RELATED APPLICATIONS

This is a continuation of International Patent Application No. PCT/CN2021/120405, filed on Sep. 24, 2021, which claims the priority to Chinese Patent Application No. 202110320833.6, titled "SEMICONDUCTOR MEMORY DEVICE AND MANUFACTURING METHOD THEREOF and filed on Mar. 25, 2021. The entire contents of" International Patent Application No. PCT/CN2021/120405 and Chinese Patent Application No. 202110320833.6 are incorporated herein by reference.

TECHNICAL FIELD

The present disclosure relates to, but is not limited to, a semiconductor memory device and a manufacturing method thereof.

BACKGROUND

A dynamic random access memory (DRAM) is a type of volatile memory, which is an indispensable key element in many electronic products. The DRAM includes a large quantity of memory cells aggregated to form an array region for storing data, and each memory cell may include a metal oxide semiconductor (MOS) transistor and a capacitor connected in series.

Currently, in a manufacturing process of a semiconductor memory device, a capacitor contact structure is generally formed on a dielectric layer. Afterwards, a capacitor structure is prepared on the capacitor contact structure, to achieve conduction between the capacitor structure and an active area. However, a semiconductor memory device manufactured by using a process in the related art usually has a parasitic capacitance due to poor isolation performance.

SUMMARY

Embodiments of the present disclosure provide a semiconductor memory device having relatively good isolation performance and a manufacturing method thereof.

A method of manufacturing a semiconductor memory device in an embodiment of the present disclosure includes:
providing a substrate having a plurality of active areas;
forming a plurality of bit line structures on the substrate, where the plurality of bit line structures are sequentially provided at intervals along a first direction;
forming a dielectric layer on the substrate, where the dielectric layer fills up at least a gap between adjacent bit line structures;
etching the dielectric layer, to form a plurality of contact holes and a plurality of isolation structures, where each contact hole is between the adjacent bit line structures, the plurality of contact holes and the plurality of isolation structures are alternately provided along a second direction, the first direction is not parallel to the second direction, and the bottom of the contact hole exposes the active area; and
forming an isolation layer on a side wall of each bit line structure and a side wall of each isolation structure.

A semiconductor memory device in an embodiment of the present disclosure includes:
a substrate having a plurality of active areas;
a plurality of bit line structures, sequentially provided at intervals on the substrate along a first direction;
a plurality of isolation structures, sequentially provided at intervals on the substrate along a second direction, where each isolation structure is located between adjacent bit line structures, every two adjacent bit line structures and every two adjacent isolation structures define one contact hole, the bottom of the contact hole exposes the active area, and the first direction is not parallel to the second direction; and
an isolation layer, formed on a side wall of each bit line structure and a side wall of each isolation structure.

BRIEF DESCRIPTION OF THE DRAWINGS

The above and other features and advantages of the present disclosure will become more apparent by describing exemplary implementations thereof in detail with reference to the accompanying drawings.

FIG. 2 is a cross-sectional view of FIG. 1 taken along A-A. FIG. 4 is a cross-sectional view of FIG. 3 taken along B-B. FIG. 6 is a cross-sectional view of FIG. 5 taken along C-C. FIG. 8 is a cross-sectional view of FIG. 7 taken along D-D. FIG. 10 is a cross-sectional view of FIG. 9 taken along E-E. FIG. 12 is a cross-sectional view of FIG. 11 taken along F-F. FIG. 13 is a cross-sectional view of FIG. 11 taken along G-G FIG. 14 is an enlarged view at a position J in FIG. 13.

DETAILED DESCRIPTION

Figure 1:
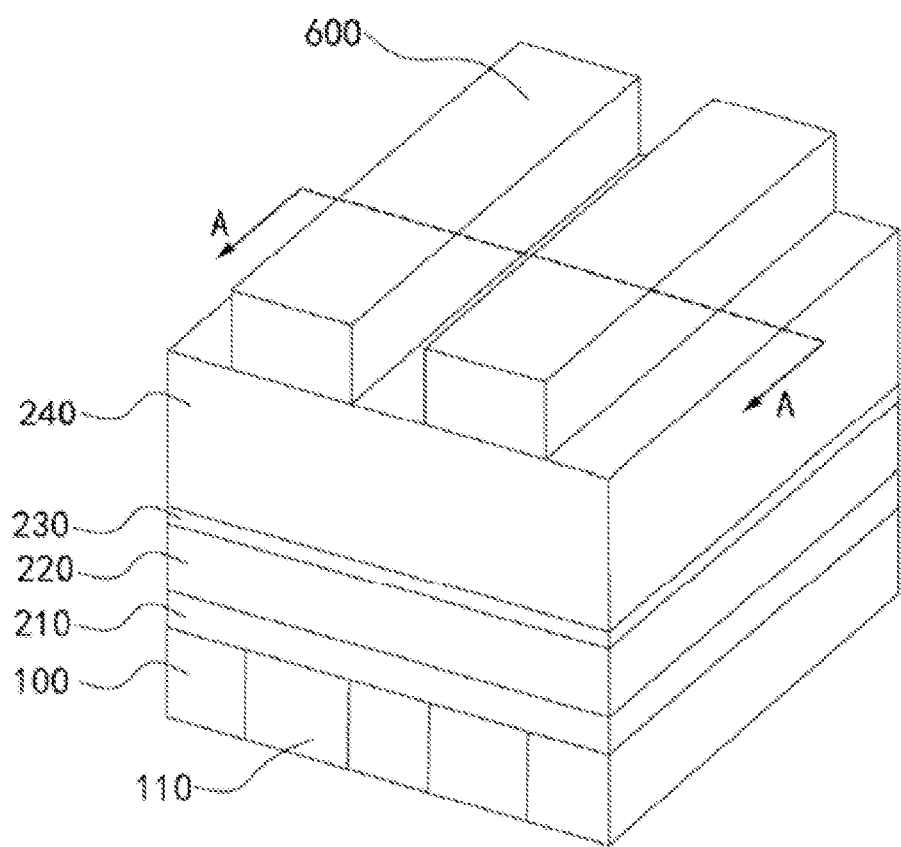
FIG. 1 to FIG. 14 are each a schematic structural diagram of a method of manufacturing a semiconductor memory device at a different stage according to an embodiment of the present disclosure.

The exemplary implementations are described more comprehensively below with reference to the accompanying drawings. The exemplary implementations may be implemented in various forms, and may not be construed as being limited to those described herein. On the contrary, these implementations are provided to make the present disclosure comprehensive and complete and to fully convey the concept of the exemplary implementations to those skilled in the art. The same reference numerals in the figures indicate the same or similar structures, and thus their detailed descriptions will be omitted.

In the related art, in a manufacturing process of a semiconductor memory, when a capacitor contact structure is formed, a dielectric layer is generally first filled. The capacitor contact structure is formed in the dielectric layer. Afterwards, a capacitor structure is prepared on the capacitor contact structure, to achieve an electrical connection between the capacitor structure and the active area. However, as a device size decreases, a size of a capacitor hole increasingly decreases. Consequently, an isolation wall between adjacent bit lines usually has a parasitic capacitance due to poor isolation performance, which further affects electrical performance of the memory.

Based on this, an embodiment of the present disclosure provides a semiconductor memory device having better isolation performance and a manufacturing method thereof.

As shown in FIG. 1 to FIG. 14, an embodiment of the present disclosure provides a method of manufacturing a semiconductor memory device, including:
providing a substrate 100 including a plurality of active areas 110; forming a plurality of bit line structures 200 on the substrate 100, where the plurality of bit line structures 200 are sequentially provided at intervals along a first direction D1; forming a dielectric layer 300 on the substrate 100, where the dielectric layer 300 fills up at least a gap between adjacent bit line structures 200; etching the dielectric layer 300, to form a plurality of contact holes 700 and a plurality of isolation structures 400, where each contact hole is between the adjacent bit line structures 200, the plurality of contact holes 700 and the plurality of isolation structures 400 are alternately provided along a second direction D2, the first direction D1 is not parallel to the second direction D2, and the bottom of the contact hole 700 exposes the active area 110; and forming an isolation layer 500 on a side wall of each bit line structure 200 and a side wall of each isolation structure 400.

In an implementation, the substrate 100 including the plurality of active areas 110 is provided. Specifically, a shallow isolation trench may be formed in the substrate 100, to define the plurality of active areas 110 in the substrate 100.

Optionally, the shallow isolation trench may include a single layer or a plurality of layers of insulating materials, for example, silicon nitride, silicon oxynitride, nitrogen silicon carbide, or another appropriate insulating material.

Optionally, the substrate 100 may include a silicon substrate, an epitaxial silicon substrate, a silicon germanium substrate, a silicon carbide substrate, or a silicon-on-insulator (SOI) substrate, but is not limited thereto.

Although not shown in the figure, it may be understood that a plurality of word line structures may be formed in the substrate 100. In an implementation, the word line structure may be a buried word line, but is not limited thereto. Each word line structure may extend along a first direction D1, and each word line structure may include a word line dielectric layer, a word line, and a word line cover layer, but is not limited thereto.

In an implementation, for the word line structure, a plurality of trenches may be formed in the substrate 100, and then a word line dielectric layer, a word line, and a word line cover layer are sequentially formed in the trench, but are not limited thereto. In some embodiments, a word line structure in another type of form may be formed according to a requirement. In addition, the word line dielectric layer may include silicon oxide or another appropriate dielectric material, the word line may include aluminum, tungsten, copper, titanium aluminum alloy, or another appropriate conductive material, and the word line cover layer may include silicon nitride, silicon oxynitride, silicon carbide nitride, or another appropriate insulating material.

In an implementation, the plurality of bit line structures 200 are formed on the substrate 100, where the plurality of bit line structures 200 are sequentially provided at intervals along the first direction D1.

Figure 4:
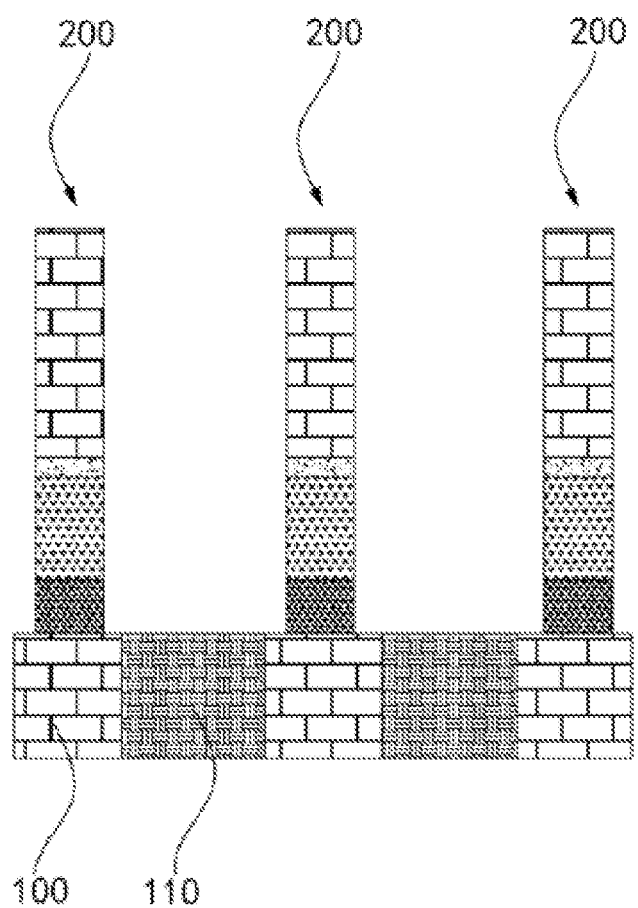

As shown in FIG. 1 and FIG. 4, the step of forming a plurality of bit line structures 200 on the substrate 100 may include:
    forming a laminated structure on a surface of the substrate 100, and forming a patterned mask 600 on a surface of the laminated structure; and etching the laminated structure according to a pattern of the patterned mask 600, to form the plurality of bit line structures 200 sequentially provided at intervals along the first direction D1.

It should be noted that, at least a part of the active area 110 should be exposed in a region between two adjacent bit line structures 200, such that a capacitor contact structure is subsequently formed between the two adjacent bit line structures 200, where the capacitor contact structure is electrically connected to the active area 110.

Figure 2:
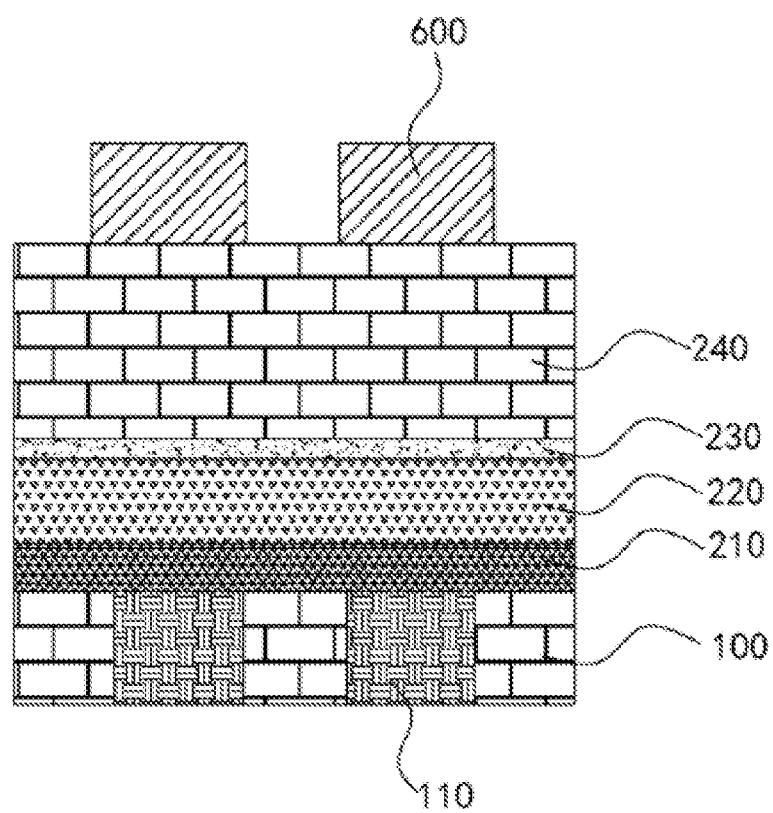
Figure 3:
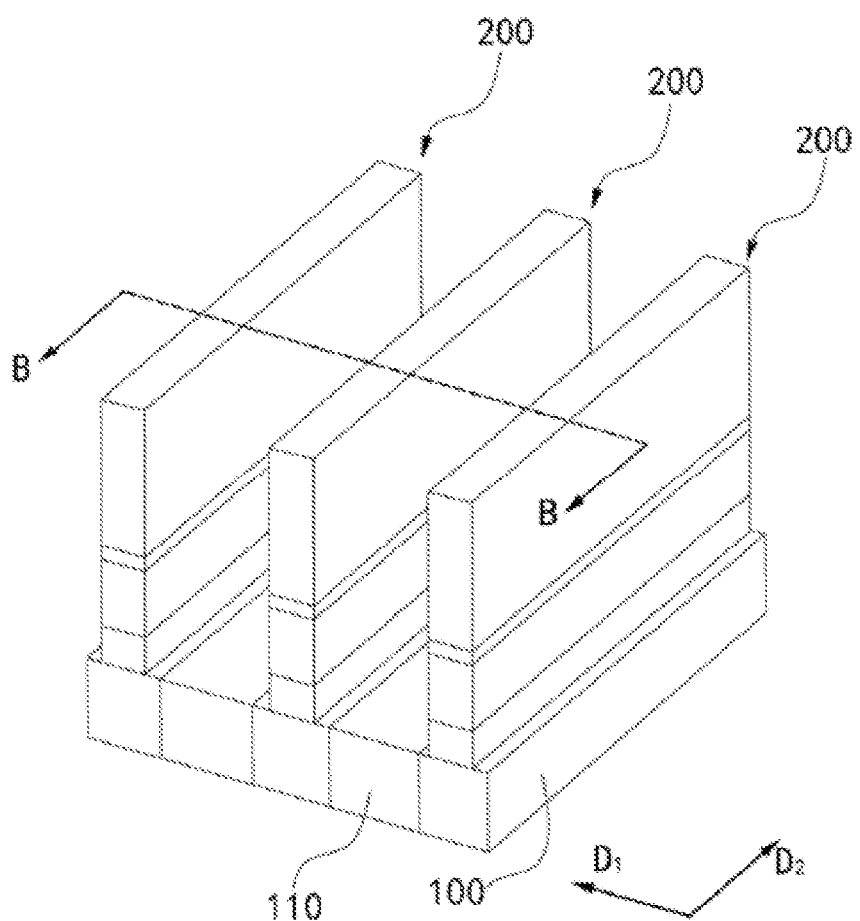

It may be understood that, as shown in FIG. 1 and FIG. 2, a region covered by the patterned mask 600 is a part that needs to be etched.

In an implementation, the step of forming a laminated structure on a surface of the substrate 100 includes:
    forming a first conductive layer 210 on the surface of the substrate 100, forming a second conductive layer 220 on a surface of the first conductive layer 210, forming an intermediate layer 230 on a surface of the second conductive layer 220, forming a cover layer 240 on a surface of the intermediate layer 230, forming the patterned mask 600 on a surface of the cover layer 240, etching the first conductive layer 210, the second conductive layer 220, the intermediate layer 230, and the cover layer 240 according to a pattern of the patterned mask 600, to form the plurality of bit line structures 200 sequentially provided at intervals along the first direction D1.

In an implementation, a material of the first conductive layer 210 may include a non-metal conductive material such as polycrystalline silicon or amorphous silicon, or another non-metal conductive material containing or not containing silicon. For example, the material of the first conductive layer 210 may be TiN.

A material of the second conductive layer 220 may include a metal conductive material such as aluminum, tungsten, copper, titanium aluminum alloy, or another appropriate low-resistance metal conductive material.

A material of the intermediate layer 230 may include silicon nitride. A material of the cover layer 240 may include silicon nitride, silicon oxynitride, nitrogen silicon carbide, or another appropriate insulating material. In an implementation, the material of the cover layer 240 may include silicon oxide.

In an implementation, after the plurality of bit line structures 200 are formed, a step of pre-cleaning each bit line structure 200 may be performed, to ensure that a side wall and a top surface of each bit line structure 200 are clean.

Figure 5:
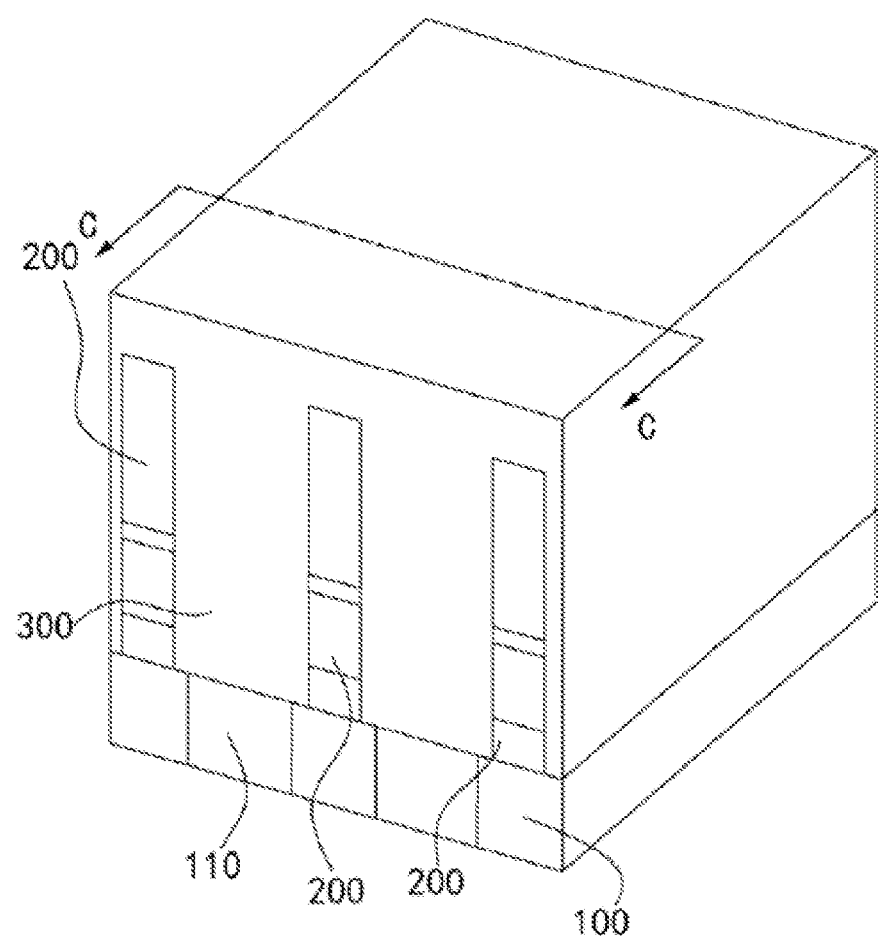
Figure 6:
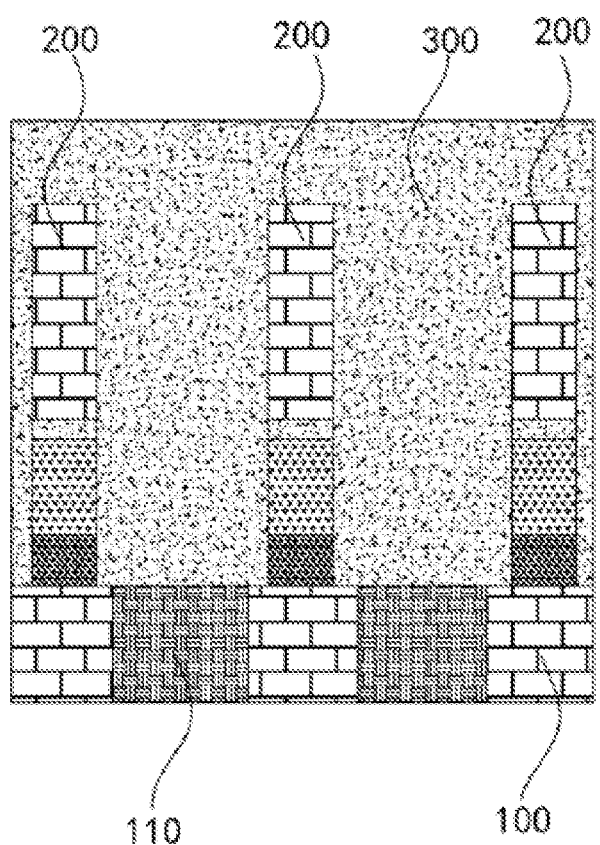

As shown in FIG. 5 and FIG. 6, after the plurality of bit line structures 200 sequentially provided at intervals along the first direction D1 are formed, the method of manufacturing a semiconductor memory device further includes:
    forming a dielectric layer 300 on the substrate 100, where the dielectric layer 300 fills up at least a gap between adjacent bit line structures 200.

It may be understood that, the method for forming the dielectric layer 300 may be thermal atomic layer deposition, plasma atomic layer deposition, or another appropriate process. In an implementation, reactants of the foregoing process may include $NH_3$ or a mixed gas of $N_2/H_2$.

In some implementations, a dielectric material may be selected for the dielectric layer 300 for use. The dielectric material may include a spin on dielectric (SOD) material or another dielectric material with a relatively good hole filling capability, such that the dielectric material may be formed between the bit line structures 200. In an implementation, a material of the dielectric layer 300 may be silicon nitride.

After the dielectric layer 300 is formed, a planarization process may be performed, for example, chemical mechanical polishing (CMP), to level a top surface of the dielectric layer 300.

As shown in FIG. 5, in this embodiment, the dielectric layer 300 not only fills a region between the adjacent bit line structures 200, but also covers the top surface of each bit line structure 200.

As shown in FIG. 7 to FIG. 10, after the dielectric layer 300 is formed, the method of manufacturing a semiconductor memory device further includes:

etching the dielectric layer 300, to form the plurality of contact holes 700 and the plurality of isolation structures 400, where each contact hole is between the adjacent bit line structures 200, the plurality of contact holes 700 and the plurality of isolation structures 400 are alternately provided along the second direction D2, where the first direction D1 is not parallel to the second direction D2, and the bottom of the contact hole 700 exposes the active area 110.

Figure 7:
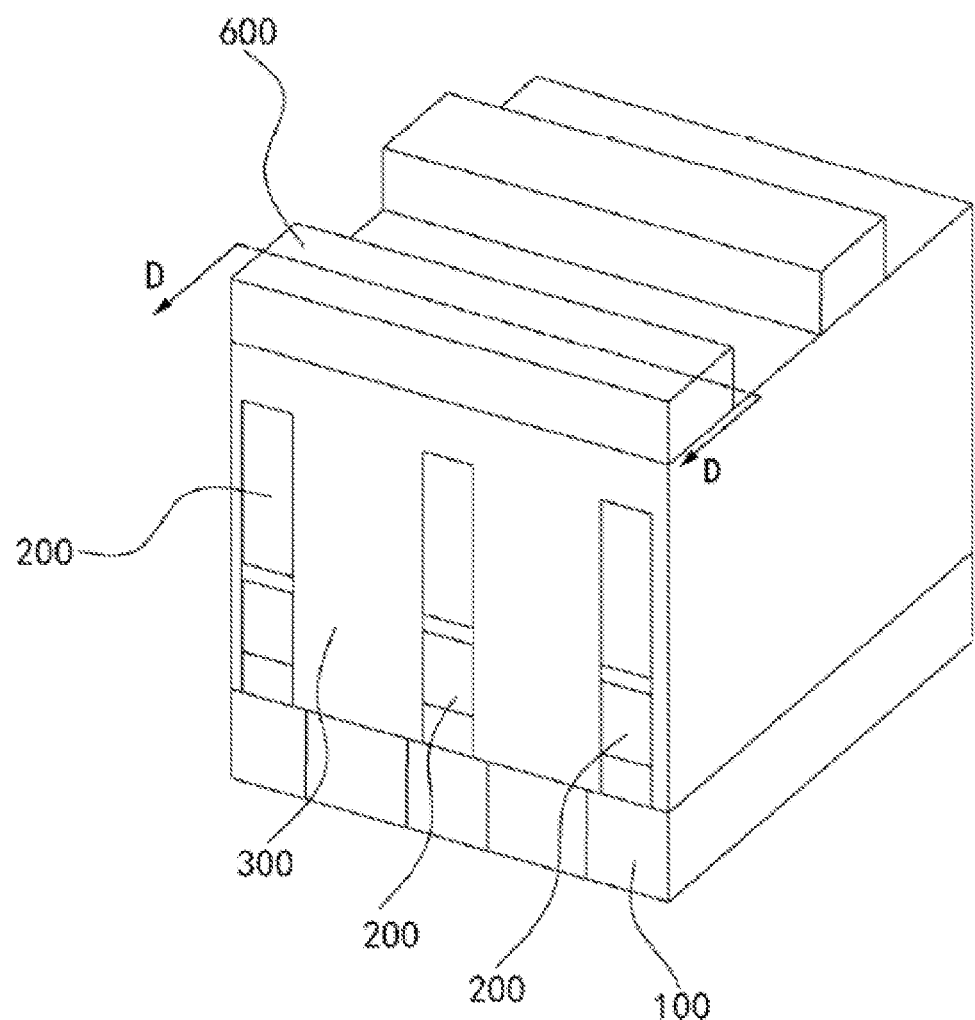
Figure 8:
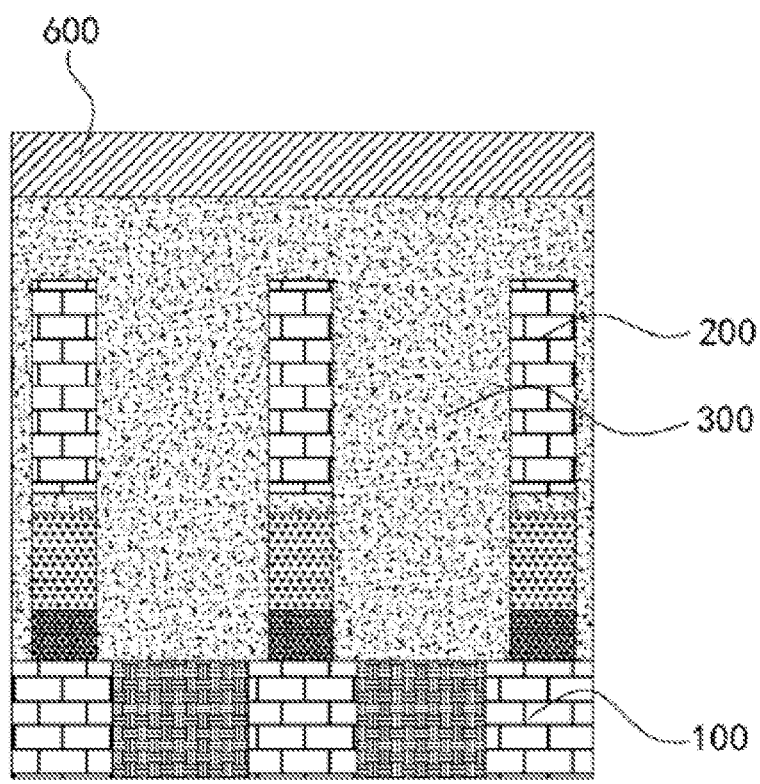

As shown in FIG. 7 and FIG. 8, the patterned mask 600 is formed on the surface of the dielectric layer 300, and the dielectric layer 300 is etched according to the pattern of the patterned mask 600, to form the plurality of contact holes 700 and the plurality of isolation structures 400.

Figure 9:
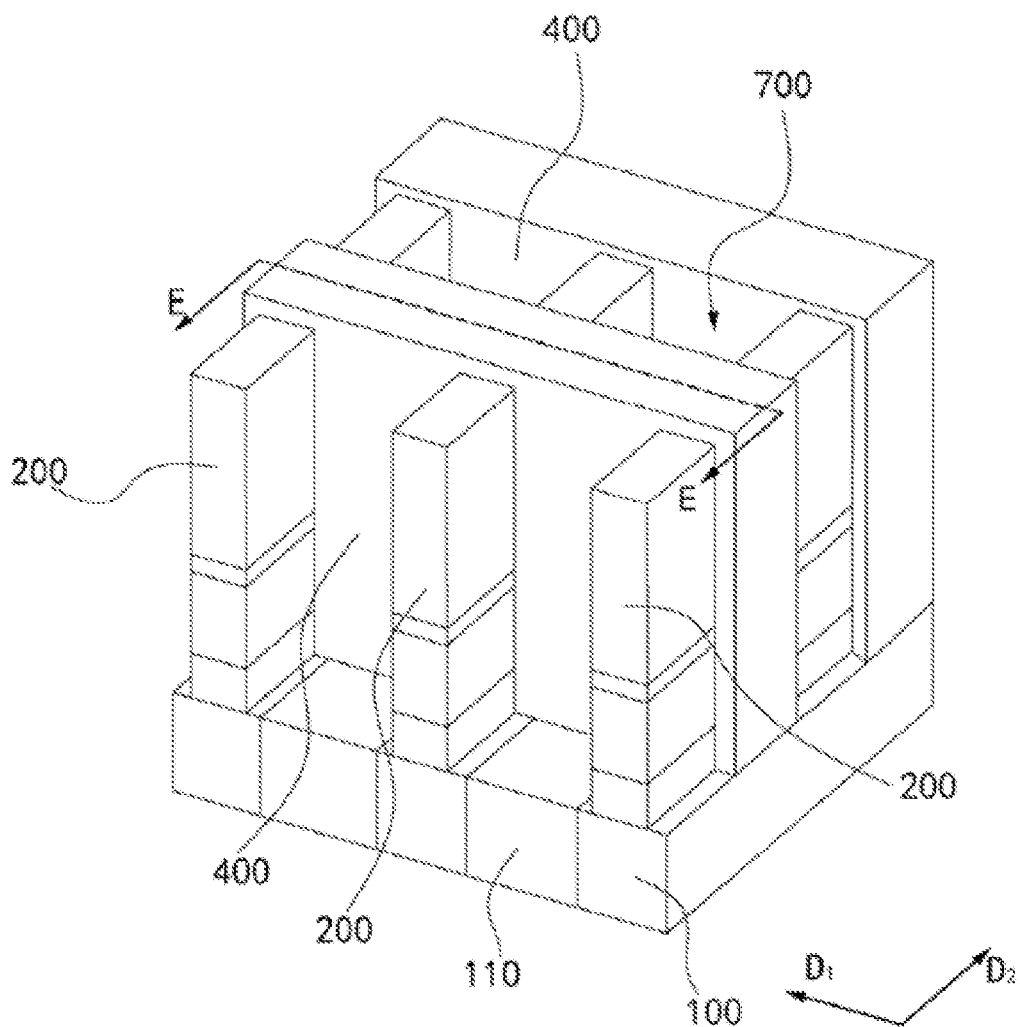
Figure 10:
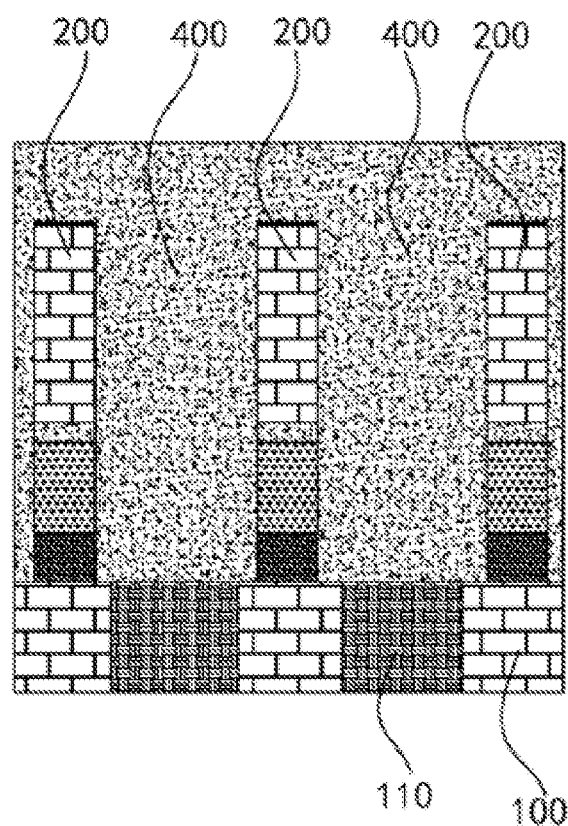
Figure 11:
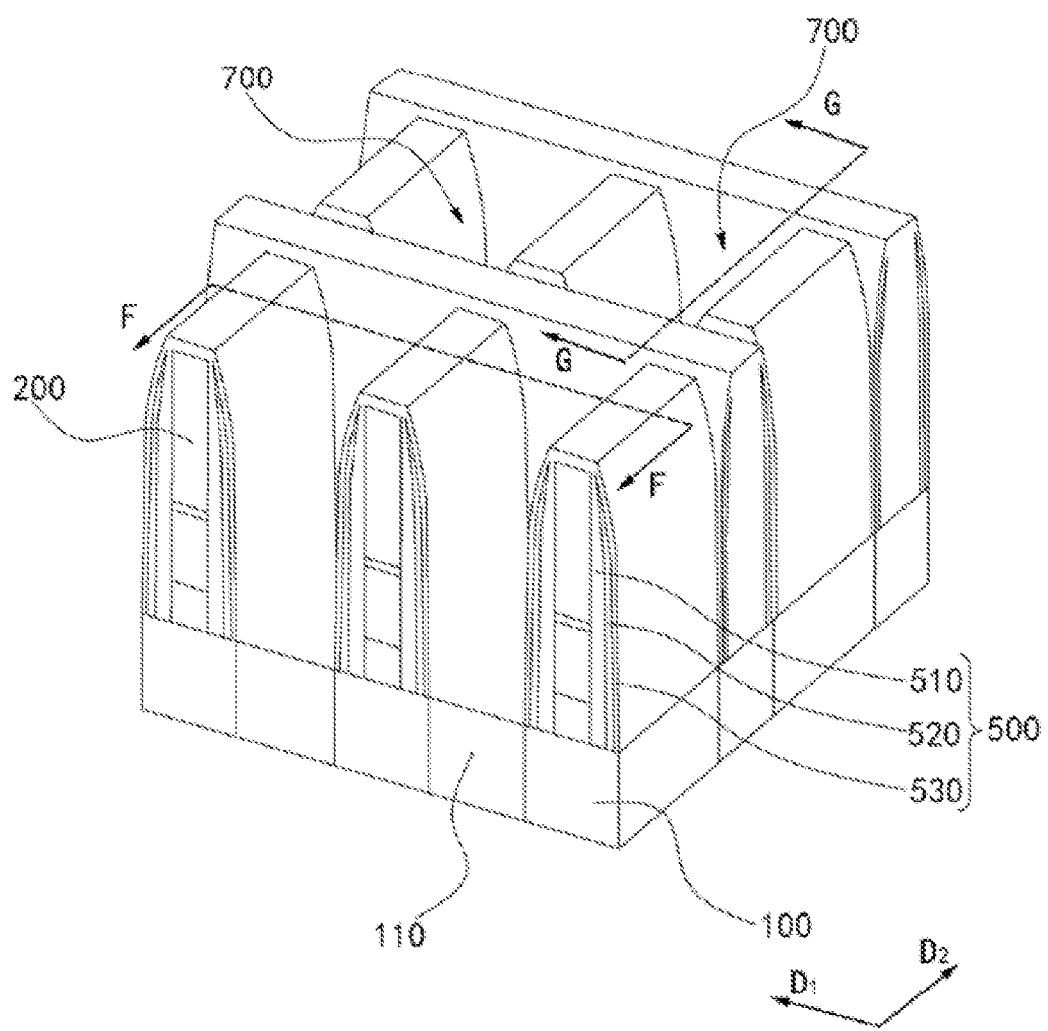

It may be understood that, as shown in FIG. 7 and FIG. 9, in this embodiment, a region of the dielectric layer 300 covered by the patterned mask 600 is an etched region, and a region not covered by the patterned mask 600 is not etched. Certainly, in another implementation, a manner in which a region of the dielectric layer 300 covered by the patterned mask 600 is not etched may alternatively be used.

As shown in FIG. 9, in an implementation, when the dielectric layer 300 is etched to form the plurality of contact holes 700 and the plurality of isolation structures 400, the dielectric layer 300 that covers the side wall and the top surface of each bit line structure 200 may be all removed, to expose the bit line structure 200.

In an implementation, the first direction D1 and the second direction D2 may be perpendicular to each other, but are not limited thereto. For example, the first direction D1 and the second direction D2 may alternatively be provided at an angle.

As shown in FIG. 11 to FIG. 14, after the plurality of contact holes 700 and the plurality of isolation structures 400 are formed, the method of manufacturing a semiconductor memory device further includes:

forming the isolation layer 500 on the side wall of each bit line structure 200 and the side wall of each isolation structure 400.

In this embodiment, after the plurality of contact holes 700 and the plurality of isolation structures 400 are formed, the isolation layer 500 is then formed. An advantage of this is that when the isolation layer 500 is formed, not only the isolation layer 500 is formed on the surface of the bit line structure 200, but also the isolation layer 500 can be formed on the surface of the isolation structure 400.

After the isolation layer 500 is formed on the side wall of each bit line structure 200, in the first direction D1, an isolation effect between the subsequently formed capacitor contact structure and the bit line structure 200 can be ensured. After the isolation layer 500 is formed on the side wall of each isolation structure 400, although as a density of memory cells increases, a distance between components in the memory cells decreases, the isolation effect is also ensured in the second direction D2 because the isolation layer 500 is also formed on the side wall of each isolation structure 400.

Accordingly, outer peripheries of capacitor contact structures formed in the contact holes 700 in the subsequent step are each provided with the isolation layer 500 to ensure overall electrical performance of the memory device.

It should be noted that, when the isolation layer 500 is formed on the side wall of each bit line structure 200 and the side wall of each isolation structure 400, the isolation layer 500 is also formed on the surface of the substrate 100. Although not shown in the figures, the method of manufacturing a semiconductor memory device in the present disclosure further includes the following step: removing the isolation layer 500 on the surface of the substrate 100 by using an anisotropic dry etching process, such that at least a part of the active area 110 is exposed.

Figure 12:
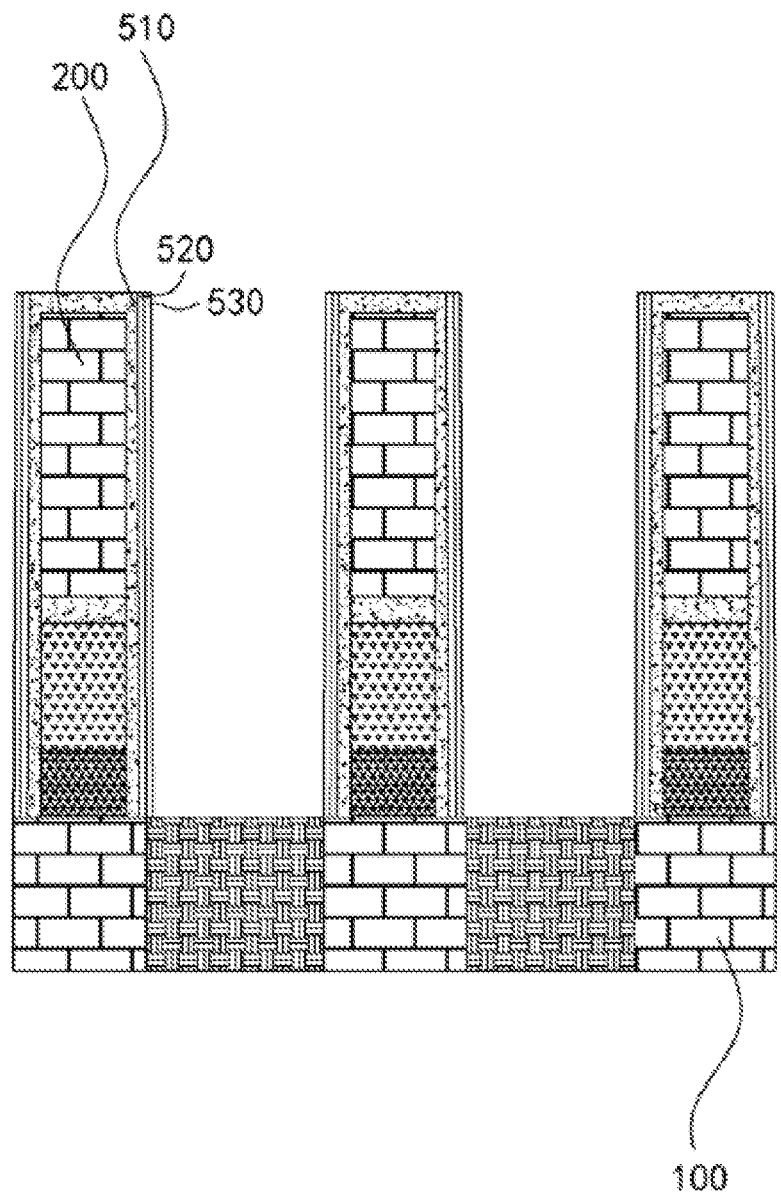
Figure 13:
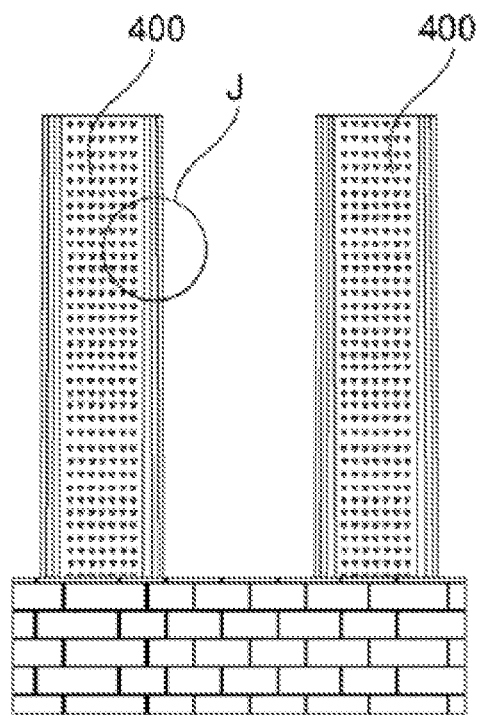
Figure 14:
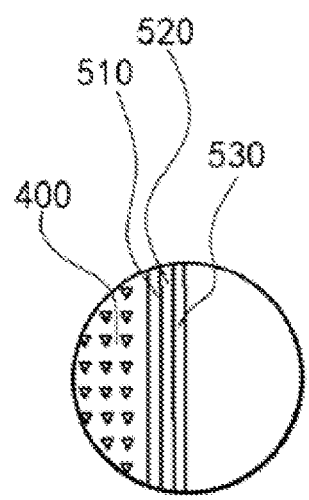

With reference to FIG. 12 to FIG. 14, the isolation layer 500 on the surface of the bit line structure 200 and the surface of the isolation structure 400 is described in detail below. FIG. 12 is a cross-sectional view of FIG. 11 taken along F-F. FIG. 13 is a cross-sectional view of FIG. 11 taken along G-G FIG. 14 is a partial enlarged view at a position J in FIG. 13.

The step of forming an isolation layer 500 on a side wall of each bit line structure 200 and a side wall of each isolation structure 400 includes:

forming a first isolation layer 510 on the side wall of each bit line structure 200 and the side wall of each isolation structure 400; and forming a second isolation layer 520 on a surface of the first isolation layer 510, where a material of the first isolation layer 510 is different from a material of the second isolation layer 520.

In an implementation, the material of the first isolation layer 510 includes silicon nitride, and the material of the second isolation layer 520 includes silicon oxide, that is, an O—N structure is selected for the isolation layer in this embodiment.

In this embodiment, a uniform and dense silicon oxide layer may be obtained by using an atomic layer deposition (ALD) method. The silicon oxide layer can strengthen the isolation effect between the bit line structure 200 and the capacitor contact structure formed in a subsequent process, reducing a parasitic capacitance. For example, when the isolation layer includes silicon oxide, and an outer layer of the bit line structure 200 is silicon nitride, a $C_xF_y$ series gas (such as $C_4F_6$) may be used as a main etching gas source to perform anisotropic dry etching with a selective ratio to silicon oxide to remove the silicon oxide layer from the surface of the substrate 100.

Certainly, a chemical vapor deposition (CVD) or another appropriate process may alternatively be used in a forming method of the silicon oxide layer.

It may be understood that, an N—O—N structure may alternatively be used for the isolation layer. Specifically, a first isolation layer 510 is formed on the side wall of each bit line structure 200 and the side wall of each isolation structure 400; a second isolation layer 520 is formed on the surface of the first isolation layer 510; and a third isolation layer 530 is formed on the surface of the second isolation layer 520. A material of the first isolation layer 510 is the same as a material of the second isolation layer 520, and is different from a material of the second isolation layer 520.

In an implementation, both the material of the first isolation layer 510 and the material of the third isolation layer 530 include silicon nitride, and the material of the second isolation layer 520 includes silicon oxide.

In this embodiment, the isolation layer includes a silicon nitride layer, a silicon oxide layer, and a silicon nitride layer provided in a stack, which can further strengthen the isolation between the bit line structure 200 and the capacitor contact structure formed by the subsequent process.

Optionally, the silicon nitride layer may be deposited by using the chemical vapor deposition (CVD) process.

In an implementation, the method of manufacturing a semiconductor memory device in the present disclosure further includes: forming the isolation layer 500 on the top of each bit line structure 200 and the top of each isolation structure 400.

Specifically, after the plurality of contact holes 700 and the plurality of isolation structures 400 are formed, the isolation layer is formed on both of the side wall and the top of each bit line structure 200 and the side wall and the top of each isolation structure 400.

According to another aspect of the present disclosure, a semiconductor memory device is further provided, including: a substrate 100 having a plurality of active areas 110, a plurality of bit line structures 200, a plurality of isolation structures 400, and an isolation layer. The plurality of bit line structures 200 are sequentially provided at intervals on the substrate 100 along a first direction D1. The plurality of isolation structures 400 are sequentially provided at intervals on the substrate 100 along a second direction D2, and each isolation structure is located between adjacent bit line structures 200. Every two adjacent bit line structures 200 and every two adjacent isolation structures 400 define one contact hole 700. The bottom of the contact hole 700 exposes the active area 110, and the first direction D1 is not parallel to the second direction D2. The isolation layer is formed on the side wall of each bit line structure 200 and the side wall of the isolation structure 400.

After the isolation layer 500 is formed on the side wall of each bit line structure 200, in the first direction D1, an isolation effect between the subsequently formed capacitor contact structure and the bit line structure 200 can be ensured. After the isolation layer is formed on the side wall of each isolation structure 400, although as a density of memory cells increases, a distance between components in the memory cells decreases, the isolation effect is also ensured in the second direction D2 because the isolation layer is also formed on the side wall of each isolation structure 400.

In an implementation, the isolation layer includes a first isolation layer 510 and a second isolation layer 520, the first isolation layer 510 is formed on the side wall of each bit line structure 200 and the side wall of each isolation structure 400, and the second isolation layer 520 is formed on a surface of the first isolation layer 510. A material of the first isolation layer 510 is different from a material of the second isolation layer 520.

In an implementation, the first isolation layer 510 includes silicon oxide, and the second isolation layer 520 includes silicon nitride, that is, an O—N structure is selected for the isolation layer in this embodiment.

In an implementation, the isolation layer further includes a third isolation layer 530, and the third isolation layer 530 is formed on a surface of the second isolation layer 520. The material of the first isolation layer 510 is the same as the material of the second isolation layer 520. Both the first isolation layer 510 and the third isolation layer 530 include silicon nitride, and the second isolation layer 520 includes silicon oxide.

In an implementation, the isolation layer is further formed on the top of each bit line structure 200 and the top of each isolation structure 400.

In an implementation, each bit line structure 200 includes a first conductive layer 210, a second conductive layer 220, and a cover layer 240, the first conductive layer 210 is provided on the substrate 100, the second conductive layer 220 is provided on a surface of the first conductive layer 210, and the cover layer 240 is provided on a surface of the second conductive layer 220. The cover layer 240 includes silicon oxide.

In an implementation, each bit line structure 200 further includes an intermediate layer 230, the intermediate layer 230 is provided between the second conductive layer 220 and the cover layer 240, and the intermediate layer 230 includes silicon nitride.

In conclusion, the semiconductor memory device and the manufacturing method thereof in the embodiments of the present disclosure have the following advantages and beneficial effects:

In the semiconductor memory device and the manufacturing method thereof in the embodiments of the present disclosure, after the isolation layer is formed on the side wall of each bit line structure 200, in the first direction D1, the isolation effect between the subsequently formed capacitor contact structure and the bit line structure 200 can be ensured. After the isolation layer is formed on the side wall of each isolation structure 400, although as a density of memory cells increases, a distance between components in the memory cells decreases, the isolation effect is also ensured in the second direction D2 because the isolation layer is also formed on the side wall of each isolation structure 400. Outer peripheries of capacitor contact structures formed in the contact holes 700 in the subsequent step are each provided with the isolation layer to ensure overall electrical performance of the memory device.

In the disclosed embodiments, the terms "first", "second", and "third" are used only for descriptive purposes, and should be understood as indicating or implying relative importance; and the term "a plurality of" refers to two or more, unless otherwise specifically defined. The terms such as "mounted to", "connected with", "connected to", or "fixed to" should be comprehended in a broad sense. For example, "connected to" may be comprehended as being fixedly connected, detachably connected, or integrally connected; "connected with" may be directly connected or indirectly connected through an intermediary. Those of ordinary skill in the art may understand specific meanings of the foregoing terms in the disclosed embodiments according to specific circumstances.

It should be understood that in the description of the disclosed embodiments, the terms such as "top", "bottom", "left", "right", "front", and "rear" indicate the orientation or position relationships based on the accompanying drawings. These terms are merely intended to facilitate description of the disclosed embodiments and simplify the description, rather than to indicate or imply that the mentioned device or element must have a specific direction and must be constructed and operated in a specific orientation. Therefore, these terms should not be construed as a limitation to the disclosed embodiments.

In the description of this specification, the description with reference to the terms such as "one embodiment", "some embodiments", and "a specific embodiment" means that the specific features, structures, materials, or characteristics described with reference to the embodiment or example are included in at least one embodiment or example of the disclosed embodiments. In this specification, the schematic expression of the above terms does not necessarily refer to the same embodiment or example. Furthermore, the specific features, structures, materials, or characteristics described may be combined in a suitable manner in any one or more of embodiments or examples.

The above are only preferred embodiments of the disclosed embodiments, and are not used to limit the disclosed embodiments. For those skilled in the art, the disclosed embodiments may have various modifications and changes. Any modification, equivalent replacement, improvement, or the like made within the spirit and principle of the disclosed embodiments shall fall within the protection scope of the disclosed embodiments.

The invention claimed is:

1. A method of manufacturing a semiconductor memory device, comprising:
   providing a substrate having a plurality of active areas;
   forming a plurality of bit line structures on the substrate, wherein the plurality of bit line structures are sequentially provided at intervals along a first direction;
   forming a dielectric layer on the substrate, wherein the dielectric layer fills up at least a gap between adjacent bit line structures;
   etching the dielectric layer, to form a plurality of contact holes and a plurality of isolation structures, wherein each contact hole is between the adjacent bit line structures, the plurality of contact holes and the plurality of isolation structures are alternately provided along a second direction, the first direction is not parallel to the second direction, and a bottom of the contact hole exposes the active area;
   forming an isolation layer on a side wall of each bit line structure and a side wall of each isolation structure; and
   forming the isolation layer on a top of each bit line structure and a top of each isolation structure.

2. The method of manufacturing a semiconductor memory device according to claim 1, wherein
   the step of forming an isolation layer on a side wall of each bit line structure and a side wall of each isolation structure comprises:
   forming a first isolation layer on the side wall of each bit line structure and the side wall of each isolation structure; and
   forming a second isolation layer on a surface of the first isolation layer, wherein
   a material of the first isolation layer is different from a material of the second isolation layer.

3. The method of manufacturing a semiconductor memory device according to claim 2, wherein
   the material of the first isolation layer comprises silicon nitride, and the material of the second isolation layer comprises silicon oxide.

4. The method of manufacturing a semiconductor memory device according to claim 2, wherein
   the step of forming an isolation layer on a side wall of each bit line structure and a side wall of each isolation structure further comprises:
   forming a third isolation layer on the second isolation layer, wherein
   the material of the first isolation layer is the same as a material of the third isolation layer.

5. The method of manufacturing a semiconductor memory device according to claim 4, wherein
   both the material of the first isolation layer and the material of the third isolation layer comprise silicon nitride, and the material of the second isolation layer comprises silicon oxide.

6. The method of manufacturing a semiconductor memory device according to claim 1, wherein
   the step of forming a plurality of bit line structures on the substrate comprises:
   forming a laminated structure on a surface of the substrate;
   forming a patterned mask on a surface of the laminated structure; and
   etching the laminated structure by using the patterned mask as a mask.

7. The method of manufacturing a semiconductor memory device according to claim 6, wherein
   the step of forming a laminated structure on a surface of the substrate comprises:
   forming a first conductive layer on the substrate;
   forming a second conductive layer on the first conductive layer; and
   forming a cover layer on the second conductive layer, wherein a material of the cover layer comprises silicon oxide.

8. The method of manufacturing a semiconductor memory device according to claim 7, wherein
   after the forming a second conductive layer on the first conductive layer, and before the forming a cover layer on the second conductive layer, the method of manufacturing a semiconductor memory device further comprises:
   forming an intermediate layer on the second conductive layer, wherein a material of the intermediate layer comprises silicon nitride.

9. The method of manufacturing a semiconductor memory device according to claim 7, wherein
   a material of the first conductive layer comprises TiN.

10. The method of manufacturing a semiconductor memory device according to claim 1, wherein
    after the forming a plurality of bit line structures, the method of manufacturing a semiconductor memory device further comprises:
    performing a step of pre-cleaning each bit line structure.

11. A semiconductor memory device, comprising:
    a substrate having a plurality of active areas;
    a plurality of bit line structures, sequentially provided at intervals on the substrate along a first direction;
    a plurality of isolation structures, sequentially provided at intervals on the substrate along a second direction, wherein each isolation structure is located between adjacent bit line structures, every two adjacent bit line structures and every two adjacent isolation structures define one contact hole, a bottom of the contact hole exposes the active area, and the first direction is not parallel to the second direction; and
    an isolation layer, formed on a side wall of each bit line structure and a side wall of each isolation structure;
    wherein the isolation layer is further formed on a top of each bit line structure and a top of each isolation structure.

12. The semiconductor memory device according to claim 11, wherein
    the isolation layer comprises a first isolation layer and a second isolation layer, the first isolation layer is formed on the side wall of each bit line structure and the side wall of each isolation structure, and the second isolation layer is formed on a surface of the first isolation layer; and
    a material of the first isolation layer is different from a material of the second isolation layer.

13. The semiconductor memory device according to claim 12, wherein
    the material of the first isolation layer comprises silicon nitride, and the material of the second isolation layer comprises silicon oxide.

14. The semiconductor memory device according to claim 12, wherein
    the isolation layer further comprises a third isolation layer, and the third isolation layer is formed on a surface of the second isolation layer; and the material of the first isolation layer is the same as a material of the third isolation layer.

15. The semiconductor memory device according to claim 14, wherein
both the material of the first isolation layer and the material of the third isolation layer comprise silicon nitride, and the material of the second isolation layer comprises silicon oxide.

16. The semiconductor memory device according to claim 11, wherein
each bit line structure comprises a first conductive layer, a second conductive layer, and a cover layer, the first conductive layer is provided on the substrate, the second conductive layer is provided on a surface of the first conductive layer, and the cover layer is provided on a surface of the second conductive layer; and
a material of the cover layer comprises silicon oxide.

17. The semiconductor memory device according to claim 16, wherein
each bit line structure further comprises an intermediate layer, the intermediate layer is provided between the second conductive layer and the cover layer, and a material of the intermediate layer comprises silicon nitride.

18. The semiconductor memory device according to claim 16, wherein
a material of the first conductive layer comprises TiN.

* * * * *